(12) United States Patent
Torti et al.

(10) Patent No.: US 10,115,460 B2
(45) Date of Patent: Oct. 30, 2018

(54) PHASE-CHANGE MEMORY DEVICE WITH DRIVE CIRCUIT

(71) Applicant: STMicroelectronics S.r.l., Agrate Brianza (IT)

(72) Inventors: Cesare Torti, Pavia (IT); Fabio Enrico Carlo Disegni, Spino d'adda (IT); Davide Manfre', Pandino (IT); Massimo Fidone, Misterbianco (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/639,540

(22) Filed: Jun. 30, 2017

(65) Prior Publication Data

US 2018/0151223 A1    May 31, 2018

(30) Foreign Application Priority Data

Nov. 30, 2016 (IT) .................. 102016000121631

(51) Int. Cl.
| | |
|---|---|
| *G11C 13/00* | (2006.01) |
| *G11C 8/08* | (2006.01) |
| *H01L 27/24* | (2006.01) |
| *H01L 29/78* | (2006.01) |
| *H01L 45/00* | (2006.01) |

(52) U.S. Cl.
CPC ............ *G11C 13/0028* (2013.01); *G11C 8/08* (2013.01); *G11C 13/0004* (2013.01); *G11C 13/004* (2013.01); *G11C 13/0038* (2013.01); *G11C 13/0069* (2013.01); *H01L 27/2436* (2013.01); *H01L 29/7841* (2013.01); *H01L 45/06* (2013.01)

(58) Field of Classification Search
CPC ............ G11C 13/0002; G11C 13/0004; G11C 13/004; G11C 13/0021; G11C 13/0028; G11C 13/0038; G11C 13/0069; G11C 8/08; H01L 27/2436; H01L 29/7841; H01L 45/06
USPC .............................. 365/163, 148, 158, 189.09
See application file for complete search history.

(56) References Cited

U.S. PATENT DOCUMENTS

| | | | |
|---|---|---|---|
| 6,259,631 B1 * | 7/2001 | Menichelli ............... | G11C 8/08 365/185.23 |
| 7,009,885 B2 * | 3/2006 | Pekny ...................... | G11C 8/08 365/185.18 |
| 8,102,698 B2 | 1/2012 | Scheuerlein | |

(Continued)

FOREIGN PATENT DOCUMENTS

WO    2015133987 A1    9/2015

*Primary Examiner* — Tan T. Nguyen
(74) *Attorney, Agent, or Firm* — Slater Matsil, LLP

(57) ABSTRACT

A memory device includes an array of phase-change memory cells and a word line. The memory device includes a control circuit, a first pull-up MOSFET and a second pull-up MOSFET connected in series between a first power-supply node set at a first supply voltage and the word line, a first pull-down MOSFET and a second pull-down MOSFET connected in series between the word line and a second power-supply node set at a reference potential, and a biasing MOSFET connected between the word line and a third power-supply node set at a second supply voltage higher than the first supply voltage. The first and second pull-up MOSFETs and the first and second pull-down MOSFETs have breakdown voltages lower than the breakdown voltage of the biasing MOSFET.

20 Claims, 4 Drawing Sheets

(56) References Cited

U.S. PATENT DOCUMENTS

| | | |
|---|---|---|
| 8,614,911 B2 | 12/2013 | Lam et al. |
| 8,947,906 B2 | 2/2015 | Conte et al. |
| 9,466,347 B1 | 10/2016 | Pasotti et al. |
| 2003/0206428 A1 | 11/2003 | Parkinson |
| 2006/0104107 A1* | 5/2006 | Remington .............. G11C 8/08 365/154 |
| 2010/0157716 A1* | 6/2010 | Lee .......................... G11C 8/08 365/230.06 |
| 2011/0063890 A1 | 3/2011 | Tonomura et al. |
| 2013/0135941 A1* | 5/2013 | Reohr ................... G11C 11/406 365/189.02 |
| 2013/0229864 A1 | 9/2013 | Conte et al. |
| 2013/0258766 A1 | 10/2013 | Conte et al. |
| 2013/0301348 A1 | 11/2013 | Perroni et al. |
| 2014/0062543 A1* | 3/2014 | Chen ...................... G11C 16/08 327/109 |

\* cited by examiner

PHASE-CHANGE MEMORY DEVICE WITH DRIVE CIRCUIT

CROSS-REFERENCE TO RELATED APPLICATIONS

This application claims priority to Italian Patent Application No. 102016000121631, filed on Nov. 30, 2016, which application is hereby incorporated herein by reference.

TECHNICAL FIELD

The present invention relates to a phase-change memory (PCM) device, which includes a circuit for driving a word line at a high speed.

BACKGROUND

As is known, phase-change memories are new-generation non-volatile memories in which, in order to store information, characteristics of materials having the property of switching between phases with different electrical characteristics are exploited. These materials may switch between a disorderly/amorphous phase and a crystalline or polycrystalline orderly phase; different phases are characterized by different values of resistivity and consequently are associated to different values of a stored data item. For example, the elements of Group VI of the Periodic Table, such as tellurium (Te), selenium (Se), or antimony (Sb), also known as chalcogenides or chalcogenic materials, may be used for manufacturing phase-change memory cells. In particular, an alloy formed by germanium (Ge), antimony (Sb), and tellurium (Te), known as GST (having the chemical composition $Ge_2Sb_2Te_5$), is currently widely used in these memory cells.

Phase changes may be obtained by increasing locally the temperature of the cells of chalcogenic material, through resistive electrodes (known in general as heaters) arranged in contact with corresponding regions of chalcogenic material.

Access (or selection) devices (for example, MOSFETs) are connected to the heaters and selectively enable passage of an electric programming current through them. This electric current, by the Joule effect, generates the temperatures required for phase change.

In particular, when the chalcogenic material is in the amorphous state, and thus has a high resistivity (the so-called RESET state), it is necessary to apply a current/voltage pulse (or a suitable number of current/voltage pulses) of a duration and amplitude such as to enable the chalcogenic material to cool down slowly. Subjected to this treatment, the chalcogenic material changes its state and switches from the high-resistivity state to a low-resistivity state (the so-called SET state). Conversely, when the chalcogenic material is in the SET state, it is necessary to apply a current/voltage pulse having an appropriate duration and a high amplitude, so as to cause the chalcogenic material to return into the high-resistivity amorphous RESET state.

During reading, the state of the chalcogenic material is detected by applying a voltage sufficiently low as not to cause sensible heating thereof, and by then reading the value of the current that flows in the memory cell through a sense amplifier. Given that the current is proportional to the conductivity of the chalcogenic material, it is possible to determine in which state the material is set, and consequently to determine the data item stored in the memory cell.

FIG. 1 shows a PCM device 1, which comprises a memory array 2 formed by a plurality of memory cells 3, arranged in rows, or word lines, and columns, or bit lines. Purely by way of example, the memory array 2 shown in FIG. 1 has three word lines, designated by WL, and three bit lines, designated by BL, which enable addressing of nine memory cells 3.

Each memory cell 3 is formed by a storage element 4a and by an access element 4b, which are connected in series between a respective bit line BL and a terminal at a reference potential (for example, ground).

The storage element 4a includes an element of phase-change material (for example, a calchogenide, such as GST) and consequently is able to store data in the form of levels of resistance associated to the different phases assumed by the material itself.

The access element 4b is formed by an N-channel MOSFET, the drain terminal of which is connected to a first terminal of the storage element 4a, the second terminal of which is connected to a corresponding bit line BL. The source terminal of the MOSFET is connected to ground, whereas the gate terminal is connected to a corresponding word line WL. In this regard, a word line WL is defined by the set of the gate terminals of the access elements 4b aligned along a same row; instead, a bit line BL is defined by the set of the second terminals of the storage elements 4a aligned along a same column.

In practice, given a memory cell 3, the second terminal of the storage element 4a and the gate terminal of the access element 4b form, respectively, a bit-line terminal and a word-line terminal of the memory cell 3.

The PCM device 1 further comprises a column decoder 8 and a row decoder 10, which enable selection of the memory cells 3, on the basis of address signals received at input (designated as a whole by AS). The address signals AS may be generated by a control logic 11, which further controls the column decoder 8 and the row decoder 10 so as to enable reading and writing (also known as programming) of the memory cells 3 addressed by the address signals AS. Albeit not shown, the control logic 11 supplies to the column decoder 8 and to the row decoder 10 also control signals in order to control the aforementioned read/write operations.

The column decoder 8 and the row decoder 10 enable biasing, and thus selection, of the word lines WL and of the bit lines BL each time addressed so as to select the memory cells 3 connected thereto. In this way, reading and writing of the memory cells 3 are enabled.

In greater detail, the row decoder 10 is designed to select, on the basis of the address signals AS, a corresponding word line WL. The other word lines WL are deselected. For this purpose, the row decoder 10 comprises a decoding stage 12 and a plurality of driving circuits 14.

The decoding stage 12 receives the address signals AS and controls the driving circuits 14 on the basis of the address signals AS. Each driving circuit 14 then has an input, which is connected to the decoding stage 12. Each driving circuit 14 further has an output, which is connected to a corresponding word line WL. In addition, each driving circuit 14 is formed by a corresponding number of MOSFETs (not visible in FIG. 1). For example, each driving circuit 14 may be formed by a corresponding inverter circuit.

In practice, the driving circuit 14 biases, and thus controls, the gate terminals of the access elements 4b connected to the corresponding word line WL so as to select/deselect the word line WL, on the basis the address signals AS.

As regards the column decoder 8, it should be noted that the operations of programming of the SET and RESET states may be carried out on "words" containing a number $N_b$ of bits ($N_b$ being an integer higher than or equal to 1), i.e., on a number $N_b$ of memory cells 3 connected to a same word line WL. The column decoder 8 is consequently designed to select simultaneously, on the basis of the address signals AS, a set of $N_b$ bit lines BL, which will also be referred to as "set of bit lines to be programmed".

In practice, the column decoder 8 co-operates with the row decoder 10 so that, during the steps of reading or programming of any memory cell 3 selected, through the storage element 4a of this memory cell 3 a read current or a programming current, respectively, flows. For this purpose, the column decoder 8 is configured to provide internally two distinct paths towards the bit lines BL of the memory array 2 each time selected: a reading path, which during the reading step electrically connects each bit line BL selected to a sense-amplifier stage 17; and a programming path, which during the programming step electrically connects each bit line BL selected to a writing stage 18.

The sense-amplifier stage 17 is configured to compare the read current that circulates in the memory cell 3 selected with a reference current in order to determine the data item stored in the memory cell 3 selected. The writing stage 18 is configured to supply the programming current, which in turn depends upon whether a SET state or a RESET state is programmed in the memory cell 3 selected.

As regards programming of the memory cells 3, it should be noted that, during the writing operations, it is necessary to supply to the storage elements 4a current pulses of a high value, both in the case of programming of the SET state and in the case of programming of the RESET state.

For example, programming of the SET state may be obtained through a trapezial current pulse having an amplitude, for example, comprised between 100 μA and 200 μA, whereas programming of the RESET state may be obtained through a rectangular current pulse having a higher amplitude, for example, between 200 μA and 700 μA.

As regards, instead, the read current, it has values (for example, 30 PA) lower than the write current, so as not to damage the state programmed.

This being said, PCM devices afford numerous advantages, amongst which a high scalability. However, on account of the high programming currents, the MOSFETs that form the driving circuits 14 must be able to withstand voltages that are not particularly low (for example, 1.8 V). For this purpose, these MOSFETs may be manufactured with the so-called 150-nm technology; however, the driving circuits 14 thus manufactured are relatively slow.

In practice, the aforementioned driving circuits 14 are optimized for carrying out the programming operations, which envisage that selection of the word lines WL may occur in not particularly short times (for example, longer than 50 ns) and entail generation of relatively high voltages. However, in some contexts of application (for example, in the automotive sector), there is felt the need to be able to select the word lines WL in a fast way (for example, in times shorter than 3 ns) during the reading step. This result appears to be problematical to obtain with just the use of the aforementioned MOSFETs, without incurring in a considerable increase in the area occupation, and thus in the costs.

SUMMARY

Embodiments of the present invention provide a phase-change memory device that will solve at least in part the problems of the known art.

An example of phase-change memory device according to the invention includes an array of memory cells, which include phase-change material, and a word line. The memory device also includes a driving circuit a control circuit, which may be controlled so as to operate in a read mode or in a write mode.

A first pull-up MOSFET and a second pull-up MOSFET have channels of a first type and are connected in series between a first power-supply node configured to be set at a first supply voltage and the word line. The second pull-up MOSFET is arranged between the first pull-up MOSFET and the word line. A first pull-down MOSFET and a second pull-down MOSFET have channels of a second type and are connected in series between the word line and a second power-supply node configured to be set at a reference potential. The second pull-down MOSFET is arranged between the first pull-down MOSFET and the word line. A biasing MOSFET is connected between the word line and a third power-supply node and is configured to be set at a second supply voltage higher than the first supply voltage.

The first and second pull-up MOSFETs and the first and second pull-down MOSFETs have breakdown voltages lower than the breakdown voltage of the biasing MOSFET. The control circuit is configured to control the first pull-up MOSFET and the first pull-down MOSFET so that they will operate in a state of switching-on allowed and in a state of switching-on forbidden in a way alternating with respect to one another, as a function of an input signal indicating whether the word line is to be selected or deselected.

When operating in read mode and when operating in write mode and with the input signal indicating that the word line is to be deselected, the control circuit is configured to control the biasing MOSFET so as to decouple electrically the word line from the third power-supply node and for controlling the second pull-up MOSFET and the second pull-down MOSFET so that the first pull-up MOSFET and the first pull-down MOSFET are electrically coupled to the word line. When operating in write mode and with the input signal indicating that the word line is to be selected, the control circuit is configured to control the biasing MOSFET so as to couple electrically the word line to the third power-supply node and for controlling the second pull-up MOSFET and the second pull-down MOSFET so that the second pull-up MOSFET is in the state of switching-on forbidden and that the second pull-down MOSFET is in the state of switching-on allowed.

While this one example has been described, it is understood that the invention includes other embodiments as disclosed and claimed herein.

BRIEF DESCRIPTION OF THE DRAWINGS

For a better understanding of the present invention, preferred embodiments thereof will now be described, purely by way of non-limiting example, with reference to the attached drawings, wherein.

DETAILED DESCRIPTION OF ILLUSTRATIVE EMBODIMENTS

The present PCM device stems from the fact that the present Applicant has noted how optimization of a PCM device clashes with the different requirements that arise during the writing and reading steps.

In detail, the present Applicant has noted how, in order to speed up the reading step, it is preferable for the MOSFETs that form the driving circuits 14 to have a reduced thickness of the gate oxide (for example, to be transistors manufactured with the so-called 28-nm technology). These transistors are also characterized by a reduced area occupation. Instead, in order to prevent damage to the driving circuits 14 during the writing step, it is necessary for the MOSFETs that form the driving circuits 14 to have a large thickness of the gate oxide. These transistors could thus be manufactured with the 150-nm technology.

Figure 1:
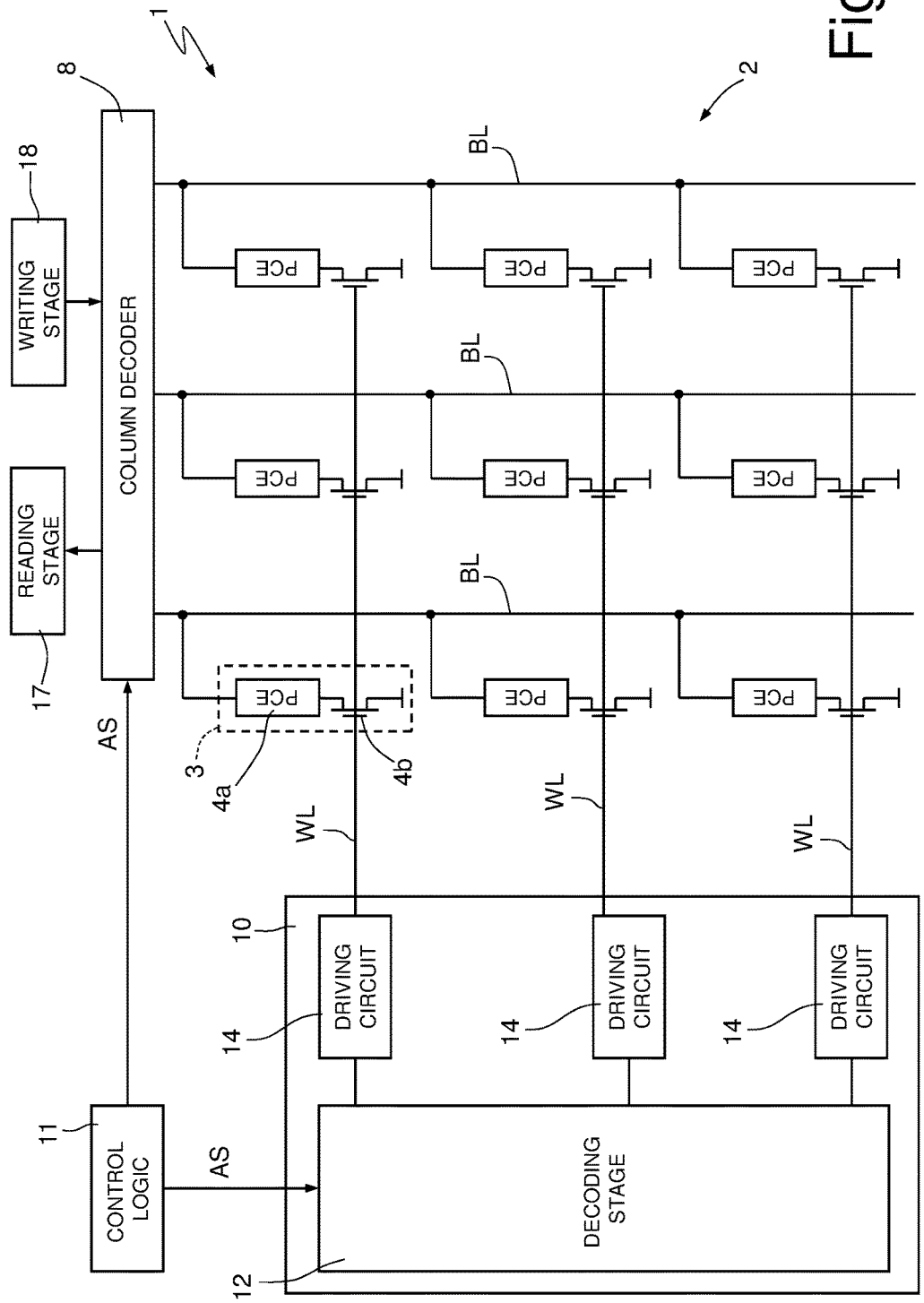
FIG. 1 shows a block diagram of a PCM device.
Figure 2:
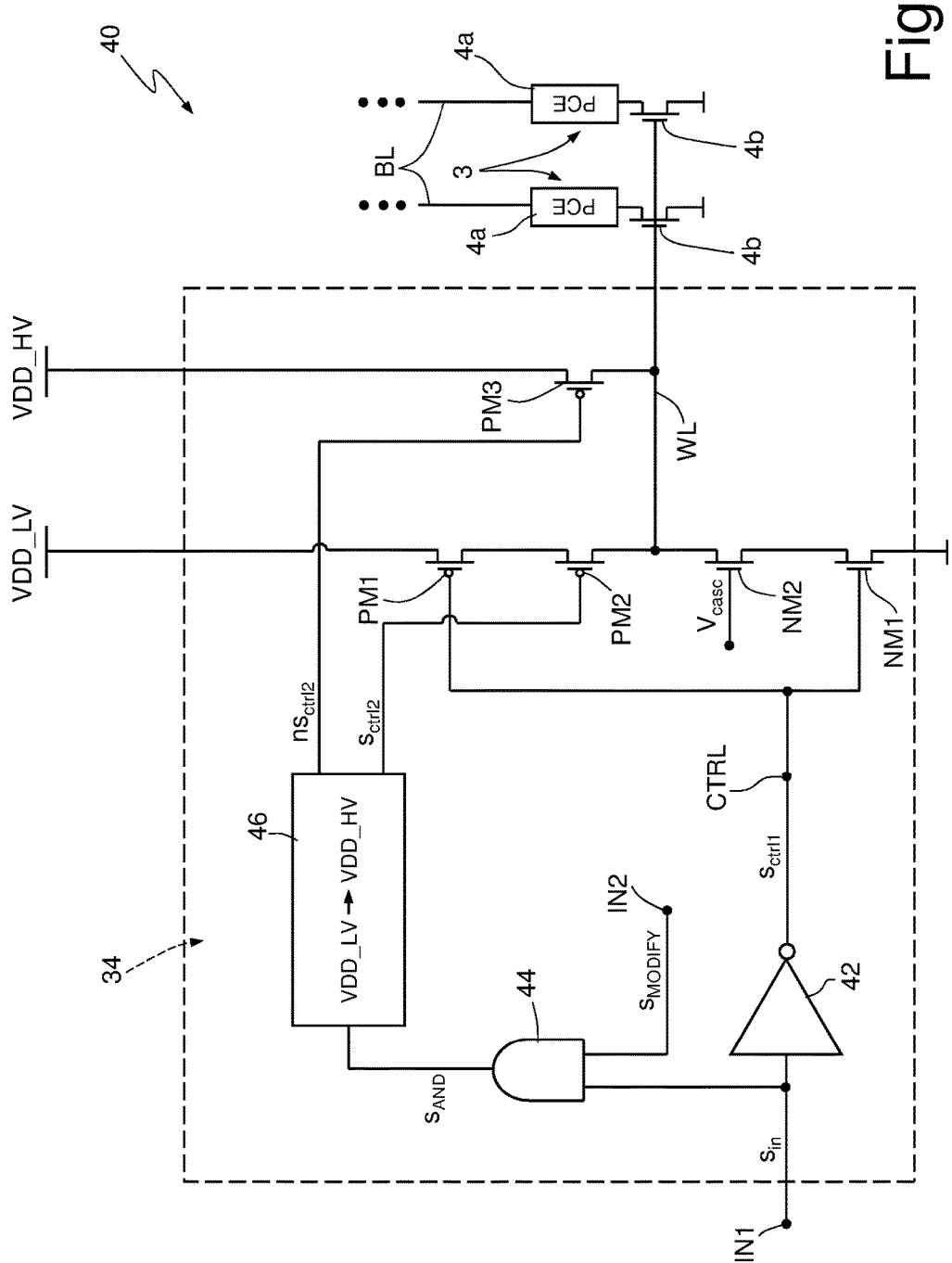
FIG. 2 shows a block diagram of a portion of a PCM device that includes the present circuit for driving a word line.

This being said, FIG. 2 shows a driving circuit (designated by 34), which is designed to function in a non-volatile PCM device of the type shown in FIG. 1. Just a part of this PCM device is shown in FIG. 2, where the PCM device is designated by 40. By way of example, the PCM device 40 may be the same as the PCM device 1 shown in FIG. 1, but for the presence of the driving circuit 34. For this reason, hereinafter the components of the PCM device 40 will be designated by the same references adopted in FIG. 1 and are not described again.

The driving circuit 34 comprises a logic inverter 42 of a known type, the input terminal of which forms a first input node IN1 of the driving circuit 34, which is connected to the decoding stage 12 (not shown in FIG. 2), so that the voltage applied thereon is controlled, in fact, by the decoding stage 12, on the basis of the address signals AS and in a per se known manner. The output terminal of the logic inverter 42 forms a control node CTRL of the driving circuit 34.

The driving circuit 34 further comprises a logic gate 44 of an AND type. A first input of the logic gate 44 is connected to the first input node IN1, whereas a second input of the logic gate 44 forms a second input node IN2 of the driving circuit 34. The second input node IN2 of the driving circuit 34 is connected (in a way not shown) to the control logic 11.

Albeit not shown in FIG. 2, the logic inverter 42 and the logic gate 44 are supplied with a first supply voltage VDD_LV, which is, for example, equal to 1 V.

The driving circuit 34 further comprises a level-shifter circuit 46, which has an input, connected to the output of the logic gate 44, and a first output and a second output, described hereinafter. Further, albeit not shown in FIG. 2, the level-shifter circuit 46 is supplied with a second supply voltage VDD_HV, which is higher than the first supply voltage VDD_LV and is, for example, equal to 1.8 V.

The driving circuit 34 further comprises a first MOSFET PM1 and a second MOSFET NM1, which will be referred to in what follows, respectively, as "first pull-up transistor PM1" and "first pull-down transistor NM1". Further, the driving circuit 34 comprises a third MOSFET PM2 and a fourth MOSFET NM2, which will be referred to in what follows respectively as "second pull-up transistor PM2" and "second pull-down transistor NM2."

The first and second pull-up transistors PM1, PM2 are of the P-channel enhancement type, whereas the first and second pull-down transistors NM1, NM2 are of the N-channel enhancement type.

The gate terminals of the first pull-up transistor PM1 and of the first pull-down transistor NM1 are connected to the output terminal of the logic inverter 42, and thus to the control node CTRL. The source terminal of the first pull-up transistor PM1 is set at the first supply voltage VDD_LV, whereas the source terminal of the first pull-down transistor NM1 is set at ground.

The drain terminal of the first pull-up transistor PM1 is connected to a first conduction terminal of the second pull-up transistor PM2. The second conduction terminal of the second pull-up transistor PM2 is connected to the word line WL. In general, these terminals will be referred to as "first and second conduction terminals of the second pull-up transistor PM2," without specifying the corresponding source/drain functions, since, as clarified hereinafter, these functions vary according to the operating mode of which the PCM device 40.

The gate terminal of the second pull-up transistor PM2 is connected to the first output of the level-shifter circuit 46.

The drain terminal of the first pull-down transistor NM1 is connected to the source terminal of the second pull-down transistor NM2, the drain terminal of which is connected to the word line WL. Further, the gate terminal of the second pull-down transistor NM2 is set at a voltage Vcasc, which is, for example, 1 V (i.e., it is equal to the first supply voltage VDD_LV) and may be generated by an appropriate circuitry (not shown).

Albeit not represented in FIG. 2, the bulk of the second pull-up transistor PM2 and, optionally, of the first pull-up transistor PM1 are set at the second supply voltage VDD_HV. The bulk of the first and second pull-down transistors NM1, NM2 are set at ground.

The driving circuit 34 further comprises a fifth MOSFET PM3, which will be referred to in what follows as "high-voltage transistor PM3", for reasons that will be clarified hereinafter.

The high-voltage transistor PM3 is of the P-channel enhancement type. The source terminal of the high-voltage transistor PM3 is set at the second supply voltage VDD_HV, whereas the drain terminal is connected to the word line WL. The gate terminal of the high-voltage transistor PM3 is connected to the second output of the level-shifter circuit 46. The bulk of the high-voltage transistor PM3 is set at the second supply voltage VDD_HV.

In greater detail, the first and second pull-up transistors PM1, PM2 and the first and second pull-down transistors NM1, NM2 are MOSFETs with a thin gate oxide, i.e., they are relatively fast transistors, but with a relatively limited capacity for withstanding high voltages. For example, the first and second pull-up transistors PM1, PM2 and the first and second pull-down transistors NM1, NM2 may be manufactured with the 28-nm technology, in which case they are able to withstand gate-to-source, gate-to-drain, and drain-to-source voltages not higher than 1.1 V. Instead, the high-voltage transistor PM3 is a transistor with a gate oxide having a thickness greater than the thickness of the gate oxides that form the first and second pull-up transistors PM1, PM2 and the first and second pull-down transistors NM1, NM2. Consequently, the high-voltage transistor PM3 is relatively slow, but has the capacity for withstanding high voltages. For example, the high-voltage transistor PM3 may be manufactured with the 150-nm technology, in which case it is in able to withstand up to 1.8 V.

Figure 3:
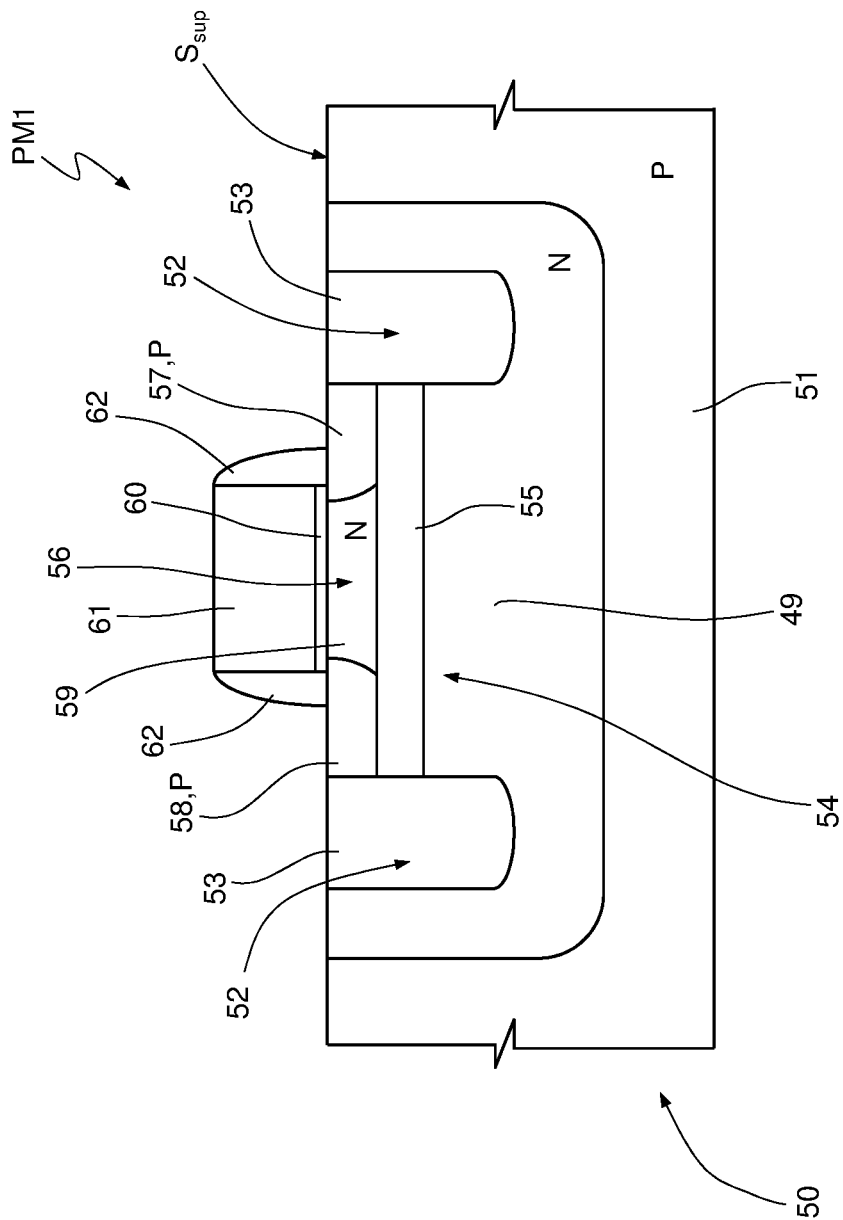
FIG. 3 is a schematic cross-sectional view of a portion of the present circuit for driving a word line.

Without any loss of generality, the first and second pull-up transistors PM1, PM2, the first and second pull-down transistors NM1, NM2, and the high-voltage transistor PM3 may be integrated in a single die, adopting the so-called fully-depleted silicon-on-insulator (FDSOI) technology. FIG. 3 is a qualitative representation of a portion of the die (designated by 50) and, purely by way of example, of the first pull-up transistor PM1.

In detail, the die 50 comprises a substrate 51 of semiconductor material, which is delimited at the top by a top surface $S_{sup}$ and has a doping of a P type, and a well 49, which has a doping of an N type and extends in the substrate 51, starting from the top surface $S_{sup}$. A trench 52 extends in the well 49, starting from the top surface $S_{sup}$. This trench 52 has a shape that is, for example, annular in top plan view and is filled by an annular insulation region 53, which in turn delimits laterally an internal region 54 of the well 49.

The first pull-up transistor PM1 further comprises a buried region 55, of dielectric material, which extends in the internal region 54 at a distance from the top surface $S_{sup}$, until it comes into contact with the annular insulation region 53. The buried region 55 and the annular insulation region 53 delimit at the bottom and laterally an active region 56 of semiconductor material 56, of an N type.

The first pull-up transistor PM1 further comprises a drain region 57 and a source region 58, which are of a P type, are laterally staggered with respect to one another, and extend in the active region 56 starting from the top surface $S_{sup}$, until they come into contact with the buried region 55. The portion of active region 56 not occupied by the drain region 57 and by the source region 58 forms a body region 59.

The first pull-up transistor PM1 further comprises a gate-oxide region 6o, which extends over the top surface $S_{sup}$, overlying the body region 59, in direct contact therewith, as well as portions of the drain region 57 and of the source region 58. Present on the gate-oxide region 60 is a conductive region 61, which is laterally surrounded by a top dielectric region 62.

Albeit not shown, also the second pull-up transistor PM2 and the first and second pull-down transistors NM1, NM2, and the high-voltage transistor PM3 are formed in the die 50. The second pull-up transistor PM2 is, for example, the same as the first pull-up transistor PM1. Further, the first and second pull-down transistors NM1, NM2 are the same as the first pull-up transistor PM1, but for the absence of the well 49 (or of a different type of conductivity of the well 49) and for the fact that the types of doping of the body region, of the drain region, and of the source region are reversed. As regards, instead, the high-voltage transistor PM3, it differs from the first and second pull-up transistors PM1, PM2 as regards the dimensions (in particular, the thickness) of the gate-oxide region, as mentioned previously.

Advantages deriving from adoption of the FDSOI technology are described hereinafter.

Irrespective of the detail regarding a possible implementation of the MOSFETs, the decoding stage 12 generates on the first input node IN1, and thus on the first input of the logic gate 44, a signal $s_{in}$, indicating whether the word line WL is to be selected or deselected. On the control node CTRL a signal $s_{ctrl1}$ is, instead, present, which is equal to the logic negation of the signal $s_{in}$ and controls the first pull-up transistor PM1 and the first pull-down transistor NM1.

On the second input node IN2 a signal $s_{MODIFY}$ is present, described hereinafter and generated by the control logic 11; on the output of the logic gate 44 a signal $s_{AND}$ is, instead, present.

As previously mentioned, the logic inverter 42 and the logic gate 44 operate in the domain of the first supply voltage VDD_LV. Consequently, each of the signals $s_{in}$, $s_{ctrl1}$, $s_{MODIFY}$ and $s_{AND}$ assumes a value, for example, equal to 1 V, when it indicates the logic value '1', whereas it is approximately zero when it indicates the logic value '0'.

This being said, the level-shifter circuit 46 generates, instead, a signal $s_{ctrl2}$ and a signal $ns_{ctrl2}$, respectively on its own first and second outputs. Consequently, the signal $s_{ctrl2}$ controls the second pull-up transistor PM2, whereas the signal $ns_{ctrl2}$ controls the high-voltage transistor PM3.

In greater detail, the signal $s_{ctrl2}$ represents a version of the signal $s_{AND}$ shifted in the domain of the second supply voltage VDD_HV; i.e., it represents the same logic values as those of the signal $s_{AND}$, but the logic value '1' is associated to a voltage approximately equal to 1.8 V. The signal $ns_{ctrl2}$ is the logic negation of the signal $s_{ctrl2}$, and also this belongs to the domain of the second supply voltage VDD_HV.

All this being said, assuming that the address signals AS are such that the driving circuit 34 has to select its own word line WL, i.e., assuming that the signal $s_{in}$ is equal to '1', and further assuming that it is necessary to carry out a reading operation, i.e., assuming that the signal $s_{MODIFY}$ is equal to '0', the following occurs.

The signals $s_{ctrl1}$, $s_{AND}$, and $s_{ctrl2}$ are equal to '0', whereas the signal $ns_{ctrl2}$ is equal to '1'; thus, it has a voltage equal to the second supply voltage VDD_HV. Consequently, the gate terminals of the first pull-down transistor NM1 and of the first and second pull-up transistors PM1, PM2 are set at a zero voltage, whereas the gate terminal of the high-voltage transistor PM3 is set at 1.8 V. Consequently, the high-voltage transistor PM3 and the first pull-down transistor NM1 are de-activated, whereas the first and second pull-up transistors PM1, PM2 and the second pull-down transistor NM2 are active. In this connection, in the present description a MOSFET the gate terminal of which is at a voltage such that passage of current through the MOSFET itself is not prevented a priori (i.e., irrespective of the state of the other MOSFETs) will be referred to as "active MOSFET".

Equivalently, an active MOSFET is in a state of switching-on allowed, which does not necessarily imply a passage of current through the transistor, since the effective onset of this passage depends, in a per se known manner, upon further conditions on the gate voltage (in particular, upon the voltages on the conduction terminals). As described hereinafter, and without this implying any loss of generality, the state of switching-on allowed of a MOSFET implies that the corresponding gate terminal is controlled with a respective gate signal (in particular, the signals $s_{ctrl1}$, Vcasc, $s_{ctrl2}$ and $ns_{ctrl2}$), which:

in the case of an N channel, is equal to the first supply voltage VDD_LV (or Vcasc, in the case of the second pull-down transistor NM2), which represents a sort of logic value '1' of this gate signal; and in the case of a P channel, is zero, i.e., it assumes a sort of logic value '0'.

Likewise, in the present description a MOSFET the gate terminal of which is at a voltage such that the passage of current is prevented a priori will be referred to as "de-activated MOSFET". Equivalently, a de-activated MOSFET is in a state of switching-on forbidden; without any loss of generality, the state of switching-on forbidden of a MOSFET implies that:

in the case of an N channel, the corresponding gate signal is zero;

in the case of a P channel, the corresponding gate signal is equal to the second supply voltage VDD_HV (which represents a logic value '1', in the respective voltage domain), if the MOSFET is either the second pull-up transistor PM2 or the high-voltage transistor PM3, or else is equal to the first supply voltage VDD_LV, if the MOSFET is the first pull-up transistor PM1.

In practice, since the second pull-up transistor PM2 and the second pull-down transistor NM2 are active, the circuit formed by the first and second pull-up transistors PM1, PM2 and by the first and second pull-down transistors NM1, NM2 functions as an inverter controlled by the signal $s_{ctrl1}$, which in turn controls the word line WL. Further, the word line WL is biased at approximately 1 V, through the first and second pull-up transistors PM1, PM2; consequently, the word line WL is decoupled from the second supply voltage VDD_HV.

In the case where, instead, a reading operation is carried out in which the word line WL is to be deselected, i.e., assuming that the signal $s_{in}$ is equal to '0' and that the signal $s_{MODIFY}$ is also equal to '0', the signal $s_{ctrl1}$ becomes equal to '1', whereas the other signals do not change. Consequently, the high-voltage transistor PM3 remains de-activated, whereas the second pull-up transistor PM2 and the second pull-down transistor NM2 remain active. The first pull-up transistor PM1 is de-activated, whereas the first pull-down transistor NM1 is active. Consequently, the circuit formed by the first and second pull-up transistors PM1, PM2 and by the first and second pull-down transistors NM1, NM2 once again functions as an inverter controlled by the signal $s_{ctrl1}$, which deselects the word line WL, connecting it to ground through the first and second pull-down transistors NM1, NM2.

In practice, during a reading operation, the word line WL is selected/deselected only through fast MOSFETs. Further, in the case where the word line WL is selected, it is biased at 1 V. In addition, since the high-voltage transistor PM3 remains de-activated, the remaining transistors are not subject to high voltages.

Assuming, instead, that a programming operation is carried out on the word line WL, i.e., assuming that the signal $s_{MODIFY}$ is equal to the logic value '1', and assuming further that the word line WL is to be selected (signal $s_{in}$ equal to '1'), the following occurs.

The signal $s_{AND}$ assumes a logic value '1', whereas the signal $s_{ctrl1}$ has a logic value '0'. Further, the signal $s_{ctrl2}$ assumes the logic value '1', whereas the signal $ns_{ctrl2}$ assumes the logic value '0'. The gate terminals of the first pull-down transistor NM1, of the first pull-up transistor PM1, and of the high-voltage transistor PM3 are set at ground. The gate terminal of the second pull-up transistor PM2 is set at 1.8 V. Consequently, the high-voltage transistor PM3 is active, as likewise the first pull-up transistor PM1 and the second pull-down transistor NM2, whereas the second pull-up transistor PM2 and the first pull-down transistor NM1 are de-activated.

In practice, during the programming operation, the word line WL is selected through the high-voltage transistor PM3, which biases it at 1.8 V.

Notwithstanding the fact that the word line WL is biased at 1.8 V, none of the first and second pull-up transistors PM1, PM2 and of the first and second pull-down transistors NM1, NM2 is subjected to voltages that risk damaging it, since each of them is operating with drain-to-source, gate-to-source, and gate-to-drain voltages not higher than the first supply voltage VDD_LV, as explained in what follows, where the aforementioned three voltages will be denoted, respectively, by $V_{ds}$, $V_{gs}$ and $V_{gd}$.

In detail, as regards the first pull-up transistor PM1, we have (in modulus): $V_{gs}$=VDD_LV, $V_{gd}$=VDD_LV, and $V_{ds}$=0.

As regards the second pull-up transistor PM2, we have (in modulus): $V_{gs}$=0, $V_{gd}$=VDD_HV−VDD_LV, and $V_{ds}$=VDD_HV−VDD_LV.

As regards the first pull-down transistor NM1, we have (in modulus): $V_{gs}$=0, $V_{gd}$=Vcasc−$V_{th\_NM2}$, and $V_{ds}$=Vcasc−$V_{th\_NM2}$, where $V_{th\_NM2}$ is the threshold voltage of the second pull-down transistor NM2 and is, for example, equal to 0.4V.

As regards the second pull-down transistor NM2, we have (in modulus): $V_{gs}$=$V_{th\_NM2}$ (the second pull-down transistor NM2, albeit active, is not traversed by current, on account of the insufficient $V_{gs}$), $V_{gd}$=VDD_HV−Vcasc, and $V_{ds}$=VDD_HV−(Vcasc−$V_{th\_NM2}$) (the latter voltage may occasionally exceed the first supply voltage VDD_LV, because current technology enables voltages higher than VDD_LV to be withstood for short periods).

Further, in the case where transistors of the FDSOI type are adopted, the advantages outlined in what follows are achieved.

With reference, for example, to the second pull-up transistor PM2, even though its second conduction terminal is set at the second supply voltage VDD_HV, its bulk may in any case be biased at the first supply voltage VDD_LV, instead of at the second supply voltage VDD_HV, without this entailing entry into forward biasing of the junction formed by the terminal set at VDD_HV and by the bulk, thanks to the insulation of the bulk. This bestows greater speed on the second pull-up transistor PM2, given the same area occupied, as compared to the case (mentioned previously) where the bulk is set conservatively at the second supply voltage VDD_HV. In this connection, in the case where the bulk of the second pull-up transistor PM2 is not insulated, an alternative that will make it possible not to penalize the speed or occupation of area would consist in pre-arranging a circuitry (not shown) designed to set the bulk of the second pull-up transistor PM2 alternatively at the first supply voltage VDD_LV or at the second supply voltage VDD_HV, according to whether a reading operation or a programming operation is carried out. Similar considerations apply in regard to the other transistors, and in particular in regard to the first pull-up transistor PM1 and to the high-voltage transistor PM3.

Finally, assuming that a programming operation is carried out in which the word line WL is deselected, i.e., assuming that the signal $s_{MODIFY}$ is equal to the logic value '1' and that the signal $s_{in}$ is equal to '0', the following occurs.

The signal $s_{AND}$ assumes a logic value '0', whereas the signal $s_{ctrl1}$ has a logic value '1'. Further, the signal $s_{ctrl2}$ assumes the logic value '0', whereas the signal $ns_{ctrl2}$ assumes the logic value '1'. The gate terminals of the first pull-down transistor NM1 and of the first pull-up transistor PM1 are set at the first supply voltage VDD_LV. The gate terminal of the second pull-up transistor PM2 is set at ground, whereas the gate terminal of the high-voltage transistor PM3 is set at the second supply voltage VDD_HV. Consequently, the high-voltage transistor PM3 is de-activated, as also the first pull-up transistor PM1, whereas the second pull-up transistor PM2 and the first and second pull-down transistors NM1, NM2 are active. In this way, the word line WL is set at ground through the first and second pull-down transistors NM1, NM2. Since in this operation the high-voltage transistor PM3 remains de-activated, the second supply voltage VDD_HV remains decoupled from the word line WL, and thus the driving circuit 34 does not risk being exposed to overvoltages.

In general, irrespective of the considerations regarding the bulk, the second pull-up transistor PM2 and the second pull-down transistor NM2 function as cascode transistors, since they are active and have no effect in the reading step, whereas they enable protection of the first pull-up transistor PM1 and the first pull-down transistor NM1 during the programming step (in particular, in the case of selection of the word line). In fact, during the programming step with selection of the word line WL, the presence of the second pull-down transistor NM2 causes a reduction of the voltages $V_{gd}$ and $V_{ds}$, below the first supply voltage VDD_LV, even though the word line WL is set at the second supply voltage VDD_HV. Further, the presence of the second pull-up transistor PM2 makes it possible to maintain the first pull-up transistor PM1 active, without subjecting it to voltages higher than the first supply voltage VDD_LV. In turn, the second pull-up transistor PM2 is protected thanks to the control based upon the signal $s_{ctrl2}$, which belongs to the voltage domain of the second supply voltage VDD_HV.

In addition, when the first pull-down transistor NM1 is switched on, the voltage of its drain terminal is approximately equal to VDD_HV/2, on the hypothesis where the first and second pull-down transistors NM1, NM2 are the same as one another, at the start of a step of discharge of the word line WL.

The advantages of the solution discussed are evident from the foregoing description.

In particular, thanks to the use of fast MOSFETs, the present driving circuit makes it possible to carry out reading operations in a very fast way (in times shorter than 3 ns), albeit enabling correct selection of the word line WL during the programming step, without exposing the MOSFETs to overvoltages. Further, the present driving circuit is characterized by a reduced occupation of area.

Finally, it is clear that modifications and variations may be made to what is described and illustrated herein, without thereby departing from the scope of the present invention, as defined in the annexed claims.

In particular, the present driving circuit is independent of the characteristics of the memory cells.

As regards the voltage Vcasc, it is higher than the voltage $V_{th\_NM2}$ and may have a value different from the one described. In general, in order to protect the first and second pull-down transistors NM1, NM2, we have, in addition to Vcasc≤VDD_LV, |Vcasc−VDD_HV|≤VDD_LV and VDD_HV−(Vcasc−$V_{th\_NM2}$)<VDD_LV. More precisely, respect of the above inequalities ideally guarantees a protection for an indefinite time. However, the aforementioned inequalities may not be respected for limited periods of time, as a function of the service life realistically expected for the PCM device 40.

Further, it is possible for the signals $s_{ctrl1}$, $s_{ctrl2}$ and $ns_{ctrl2}$ to be generated in a way different from what has been described. Consequently, the logic inverter 42 and the logic gate 44 may be replaced by a different circuitry.

As regards the signal $s_{ctrl2}$, it may assume, at its own logic value '1', a value different from the second supply voltage VDD_HV, provided that it is sufficient to de-activate the second pull-up transistor PM2 during the operations of programming of the word line WL. Consequently, it is sufficient for the signal $s_{ctrl2}$ to assume, at its own logic value '1', a voltage higher than or equal to VDD_HV−|$V_{th\_PM2}$|, where $V_{th\_PM2}$ is the threshold voltage of the second pull-up transistor PM2. Similar considerations apply for the signal $ns_{ctrl2}$ and to switching-off of the high-voltage MOSFET PM3.

The fast transistors (i.e., the first and second pull-down transistors and the first and second pull-up transistors) may have, for example, gate oxides with thicknesses different from one another; more in general, the fast transistors may have breakdown voltages different from one another, in any case lower than the breakdown voltage of the high-voltage transistor. It is further possible for the high-voltage transistor to have a gate oxide with the same thickness as the gate oxides of the fast transistors, albeit continuing to have a breakdown voltage higher than the breakdown voltages of the fast transistors.

As regards, instead, the MOSFETs that form the access elements 4b, their characteristics are irrelevant for the purposes of the present invention. For example, they may be manufactured with the same technology used for manufacturing the driving circuit 34.

In addition, it is evident that the PCM device 40 may find use in numerous contexts, such as applications with high safety requirements that use smart cards with contact interface (such as pay-TV systems) and have to satisfy stringent consumption specifications, or else applications that use contactless smart cards (RFIDs, NFCs, bank credit cards, etc.), where the memory module has a current budget obtained limited by an energy-harvesting system.

Figure 4:
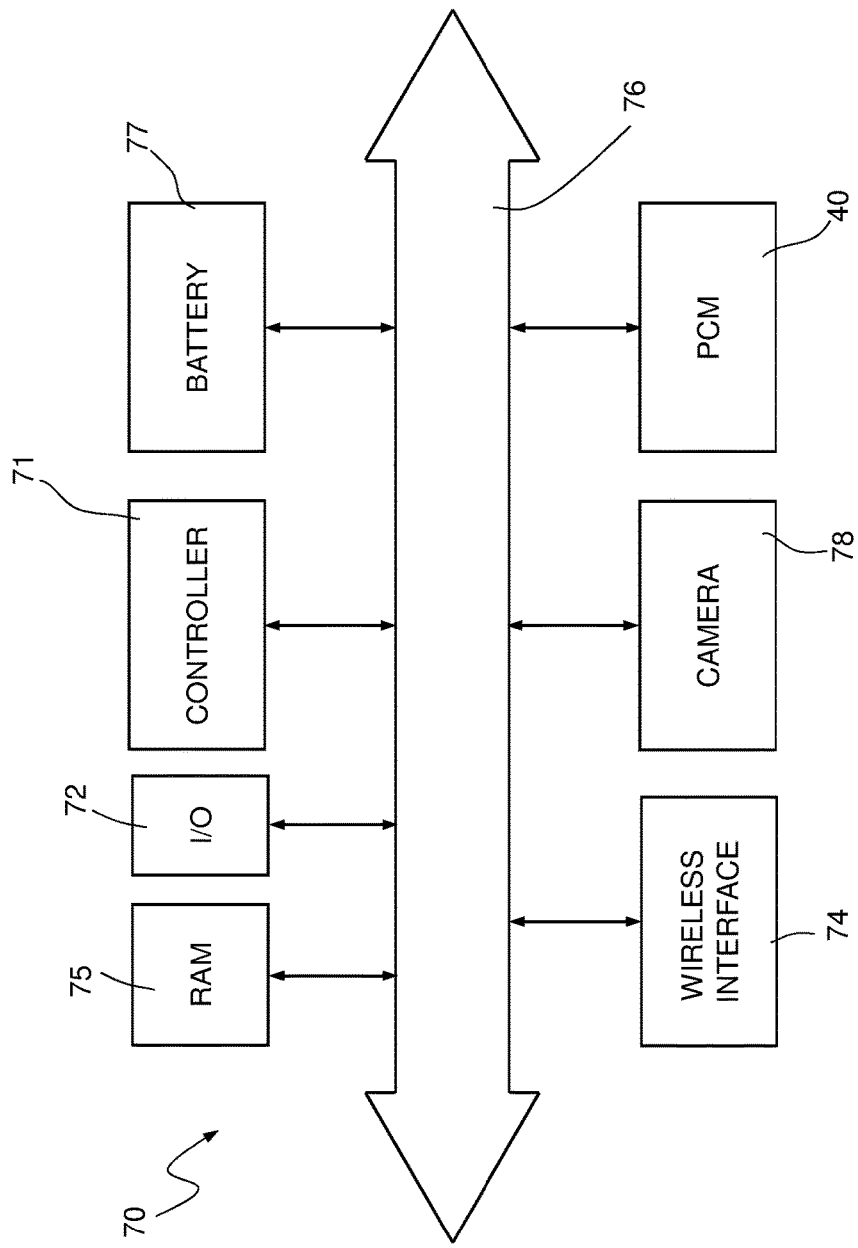
FIG. 4 is a schematic block diagram of a possible electronic apparatus that incorporate a PCM device that includes the present circuit for driving a word line.

In this connection, FIG. 4 illustrates a portion of an electronic apparatus 70, which may, for example, be a PDA (personal digital assistant), a portable or fixed computer (possibly with capacity of wireless data transfer), a cell phone, a digital audio player, a photographic camera or a camcorder, or further devices that are able to process, store, transmit, and receive information.

In detail, the electronic apparatus 70 comprises: a controller 71 (for example, provided with a microprocessor, a DSP, or a microcontroller); an input/output device 72 (for example, provided with a keypad and a display), for input and display of the data; the PCM device 40 provided with the array 2 of memory cells 3 of the phase-change type described previously; a wireless interface 74, for example, an antenna, for transmitting and receiving data through a radiofrequency wireless communication network; and a RAM 75. All the components of the electronic apparatus 70 are coupled through a bus 76. It is possible to use a battery 77 as power-supply source in the electronic apparatus 70, which may further be equipped with a photographic camera or video camera or camcorder 78. In addition, the controller 71 may control the PCM device 40, for example, co-operating with the control logic 11.

What is claimed is:

1. A memory device comprising:
   an array of memory cells, each memory cell including a phase-change material;
   a word line coupled to memory cells of the array;
   a control circuit configured to be controlled so as to operate in a read mode or in a write mode;
   a first pull-up MOSFET and a second pull-up MOSFET having channels of a first type, the first and second pull-up MOSFETs being connected in series between a first power-supply node configured to be set at a first supply voltage and the word line, the second pull-up MOSFET being arranged between the first pull-up MOSFET and the word line;
   a first pull-down MOSFET and a second pull-down MOSFET having channels of a second type, the first and second pull-down MOSFETs being connected in series between the word line and a second power-supply node configured to be set at a reference potential, the second pull-down MOSFET being arranged between the first pull-down MOSFET and the word line; and
   a biasing MOSFET coupled between the word line and a third power-supply node configured to be set at a second supply voltage that is higher than the first supply voltage, wherein the first and second pull-up MOSFETs and the first and second pull-down MOSFETs have breakdown voltages lower than a breakdown voltage of the biasing MOSFET, wherein the control circuit is coupled to the first and the second pull-up MOSFETs, the first pull-down MOSFET, and the biasing MOSFET.

2. The memory device according to claim 1, wherein each of the first and second pull-up MOSFETs, the first and second pull-down MOSFETs, and the biasing MOSFET is of a fully-depleted silicon-on-insulator (FDSOI) transistor.

3. The memory device according to claim 1, wherein the first and second pull-down MOSFETs and the first and second pull-up MOSFETs have respective gate-dielectric regions with the same first thickness, and wherein the biasing MOSFET has a gate-dielectric region with a thickness greater than the first thickness.

4. The memory device according to claim 1, wherein each of the first and second pull-up MOSFETs, the first and second pull-down MOSFETs, and the biasing MOSFET is an enhancement type MOSFET.

5. The memory device according to claim 4, wherein the first and second pull-up MOSFETs and the biasing MOSFET have channels with P conductivity, and wherein the first and second pull-down MOSFETs have channels with N conductivity.

6. A memory device comprising:
an array of memory cells, each memory cell including a phase-change material;
a word line coupled to memory cells of the array;
a control circuit configured to be controlled so as to operate in a read mode or in a write mode;
a first pull-up MOSFET and a second pull-up MOSFET having channels of a first type, the first and second pull-up MOSFETs being connected in series between a first power-supply node configured to be set at a first supply voltage and the word line, the second pull-up MOSFET being arranged between the first pull-up MOSFET and the word line;
a first pull-down MOSFET and a second pull-down MOSFET having channels of a second type, the first and second pull-down MOSFETs being connected in series between the word line and a second power-supply node configured to be set at a reference potential, the second pull-down MOSFET being arranged between the first pull-down MOSFET and the word line; and
a biasing MOSFET coupled between the word line and a third power-supply node configured to be set at a second supply voltage that is higher than the first supply voltage;
wherein the first and second pull-up MOSFETs and the first and second pull-down MOSFETs have breakdown voltages lower than a breakdown voltage of the biasing MOSFET;
wherein the control circuit is coupled to the first pull-up MOSFET and the first pull-down MOSFET and is configured to control the first pull-up MOSFET and the first pull-down MOSFET so that they will operate in a state of switching-on allowed and in a state of switching-on forbidden in a way alternating with respect to one another, as a function of an input signal that indicates whether the word line is to be selected or deselected; and
wherein, i) when operating in read mode and ii) when operating in write mode with the input signal indicating that the word line is to be deselected, the control circuit is coupled to the biasing MOSFET is configured to control the biasing MOSFET so as to electrically decouple the word line from the third power-supply node and to control the second pull-up MOSFET and the second pull-down MOSFET so that the first pull-up MOSFET and the first pull-down MOSFET are electrically coupled to the word line; and
wherein, when operating in write mode and with the input signal indicating that the word line is to be selected, the control circuit is configured to control the biasing MOSFET so as to couple electrically the word line to the third power-supply node and to control the second pull-up MOSFET and the second pull-down MOSFET so that the second pull-up MOSFET is in the state of switching-on forbidden and that the second pull-down MOSFET is in the state of switching-on allowed.

7. The memory device according to claim 6, wherein the control circuit is configured to set a gate terminal of the second pull-down MOSFET to a cascode voltage, which is higher than a threshold voltage of the second pull-down MOSFET; and
wherein, when operating in write mode and with the input signal indicating that the word line is to be selected, the control circuit is further configured to set a gate terminal of the second pull-up MOSFET at a voltage greater than or equal to the difference between the second supply voltage and the modulus of the threshold voltage of the second pull-up MOSFET.

8. The memory device according to claim 7, wherein the control circuit is configured to generate a first control signal on gate terminals of the first pull-up MOSFET and of the first pull-down MOSFET, and to generate a second control signal, on the gate terminal of the second pull-up MOSFET, wherein the first control signal ranges between the reference potential and the first supply voltage and wherein the second control signal ranges between the reference potential and the second supply voltage.

9. The memory device according to claim 8, wherein the control circuit is further configured to generate, on a gate terminal of the biasing MOSFET, a third control signal, which ranges between the reference potential and the second supply voltage and is the logic negation of the second control signal.

10. The memory device according to claim 6, wherein each of the first and second pull-up MOSFETs, the first and second pull-down MOSFETs, and the biasing MOSFET is of a fully-depleted silicon-on-insulator (FDSOI) transistor.

11. The memory device according to claim 6, wherein the first and second pull-down MOSFETs and the first and second pull-up MOSFETs have respective gate-dielectric regions with the same first thickness, and wherein the biasing MOSFET has a gate-dielectric region with a thickness greater than the first thickness.

12. The memory device according to claim 6, wherein the biasing MOSFET has a channel of the first type.

13. The memory device according to claim 6, wherein each of the first and second pull-up MOSFETs, the first and second pull-down MOSFETs, and the biasing MOSFET is an enhancement type MOSFET.

14. The memory device according to claim 13, wherein the first and second pull-up MOSFETs and the biasing MOSFET have channels with P conductivity, and wherein the first and second pull-down MOSFETs have channels with N conductivity.

15. The memory device according to claim 6, wherein each memory cell comprises a storage element and an access element, which are electrically coupled together;

wherein each storage element is formed by the phase-change material; and
wherein each access element is formed by a corresponding MOSFET.

16. An electronic apparatus comprising:
the memory device according to claim 6;
a controller; and
a bus electrically coupling the controller and the memory device.

17. A method for biasing a word line of a memory device that comprises an array of phase-change memory cells, wherein the memory device further comprises:
a first pull-up MOSFET and a second pull-up MOSFET having channels of a first type, the first and second pull-up MOSFETs being connected in series between a first power-supply node configured to be set at a first supply voltage and the word line and the second pull-up MOSFET being arranged between the first pull-up MOSFET and the word line;
a first pull-down MOSFET and a second pull-down MOSFET having channels of a second type, the first and second pull-down MOSFETs being connected in series between the word line and a second power-supply node configured to be set at a reference potential and the second pull-down MOSFET being arranged between the first pull-down MOSFET and the word line; and
a biasing MOSFET connected between the word line and a third power-supply node configured to be set at a second supply voltage that is higher than the first supply voltage, the first and second pull-up MOSFETs and the first and second pull-down MOSFETs having breakdown voltages lower than the breakdown voltage of the biasing MOSFET;
the method comprising:
controlling the first pull-up MOSFET and the first pull-down MOSFET by an input signal that indicates whether the word line is to be selected or deselected, so that they will operate in a state of switching-on allowed and in a state of switching-on forbidden in a way alternating with respect to one another, as a function of the input signal;
during a reading step, and during a writing step with the input signal indicating that the word line is to be deselected, controlling the biasing MOSFET so as to decouple electrically the word line from the third power-supply node, and controlling the second pull-up MOSFET and the second pull-down MOSFET so that the first pull-up MOSFET and the first pull-down MOSFET are electrically coupled to the word line; and
during a writing step with the input signal indicating that the word line is to be selected, controlling the biasing MOSFET so as to couple electrically the word line to the third power-supply node, and controlling the second pull-up MOSFET and the second pull-down MOSFET so that the second pull-up MOSFET is in the state of switching-on forbidden and the second pull-down MOSFET is in the state of switching-on allowed.

18. The method of biasing according to claim 17, further comprising:
setting a gate terminal of the second pull-down MOSFET at a cascode voltage, which is higher than a threshold voltage of the second pull-down MOSFET; and
during the writing step with the input signal indicating that the word line is to be selected, setting the gate terminal of the second pull-up MOSFET at a voltage higher than or equal to the difference between the second supply voltage and the modulus of a threshold voltage of the second pull-up MOSFET.

19. The method of biasing according to claim 18, further comprising:
generating a first control signal on gate terminals of the first pull-up MOSFET and of the first pull-down MOSFET, wherein the first control signal ranges between the reference potential and the first supply voltage; and
generating a second control signal on the gate terminal of the second pull-up MOSFET, wherein the second control signal ranges between the reference potential and the second supply voltage.

20. The method of biasing according to claim 19, further comprising generating, on a gate terminal of the biasing MOSFET, a third control signal, which ranges between the reference potential and the second supply voltage and is the logic negation of the second control signal.

* * * * *